US012712043B2

(12) United States Patent
Zlotnik et al.

(10) Patent No.: US 12,712,043 B2
(45) Date of Patent: Aug. 18, 2026

(54) VOLTAGE SCALING BASED ON ERROR RATE

(71) Applicant: Micron Technology, Inc., Boise, ID (US)

(72) Inventors: Leon Zlotnik, Camino, CA (US); Eyal En Gad, Highland, CA (US); Leonid Minz, Beer Sheva (IL); Sivagnanam Parthasarathy, Carlsbad, CA (US)

(73) Assignee: Micron Technology, Inc., Boise, ID (US)

( * ) Notice: Subject to any disclaimer, the term of this patent is extended or adjusted under 35 U.S.C. 154(b) by 10 days.

(21) Appl. No.: 18/773,178

(22) Filed: Jul. 15, 2024

(65) Prior Publication Data

US 2025/0028373 A1 Jan. 23, 2025

Related U.S. Application Data

(60) Provisional application No. 63/514,499, filed on Jul. 19, 2023.

(51) Int. Cl.
*G11C 29/12* (2006.01)
*G11C 29/42* (2006.01)

(52) U.S. Cl.
CPC ........ *G11C 29/12005* (2013.01); *G11C 29/42* (2013.01)

(58) Field of Classification Search
CPC .......................... G11C 29/12005; G11C 29/42
See application file for complete search history.

(56) References Cited

U.S. PATENT DOCUMENTS

| | | | | |
|---|---|---|---|---|
| 9,786,356 | B2 | 10/2017 | Wang et al. | |
| 11,256,429 | B2 * | 2/2022 | Shen | G11C 13/004 |
| 11,335,429 | B1 * | 5/2022 | Hu | G11C 29/52 |
| 2005/0246613 | A1 * | 11/2005 | Blaauw | G06F 11/0721 714/763 |
| 2009/0016140 | A1 | 1/2009 | Qureshi et al. | |
| 2010/0269004 | A1 * | 10/2010 | Flynn | G06F 11/10 714/E11.023 |
| 2011/0182119 | A1 * | 7/2011 | Strasser | G11C 29/021 365/185.24 |

(Continued)

FOREIGN PATENT DOCUMENTS

EP 3660628 12/2023

*Primary Examiner* — Joseph D Torres
(74) *Attorney, Agent, or Firm* — Brooks, Cameron & Huebsch, PLLC

(57) ABSTRACT

A method includes generating, by circuitry resident on a memory device, parity information, appending parity information to data read from the memory device to generate a bit string comprising the data read from the memory device and parity information, transmitting the bit string from the memory device to a physical input/output (PHY I/O) device couplable to the memory device via a channel, calculating a parity mismatch value based on a comparison between received memory parity information and a calculated PHY I/O parity information, determining a target parity mismatch value, comparing the calculated parity mismatch value and the determined target parity mismatch value, and regulating a voltage in response to the comparison between the calculated parity mismatch value and the target parity mismatch value to maintain an actual channel error rate within an optimal range.

18 Claims, 7 Drawing Sheets

(56) References Cited

U.S. PATENT DOCUMENTS

| | | | | |
|---|---|---|---|---|
| 2011/0219274 | A1* | 9/2011 | Cho | G11C 29/52 714/708 |
| 2012/0023382 | A1* | 1/2012 | Sandhu | G06F 1/324 714/E11.159 |
| 2013/0007516 | A1* | 1/2013 | Wu | G06F 11/076 714/15 |
| 2015/0085573 | A1* | 3/2015 | Sharon | G06F 11/004 365/185.03 |
| 2016/0132391 | A1* | 5/2016 | Thoen | G06F 11/1076 714/764 |
| 2017/0125111 | A1* | 5/2017 | Sankaranarayanan | G06F 11/0793 |
| 2017/0148525 | A1* | 5/2017 | Kathawala | G06F 11/079 |
| 2018/0011753 | A1* | 1/2018 | Alhussien | H03M 13/6325 |
| 2018/0203625 | A1* | 7/2018 | Zhang | H03M 13/2909 |
| 2018/0293029 | A1* | 10/2018 | Achtenberg | G11C 29/028 |
| 2019/0250843 | A1* | 8/2019 | Ratnam | G06F 3/0647 |
| 2020/0066354 | A1* | 2/2020 | Ioannou | G11C 16/26 |
| 2021/0012856 | A1* | 1/2021 | Xie | G11C 29/50004 |
| 2021/0012857 | A1* | 1/2021 | Xie | G06F 11/10 |
| 2021/0073070 | A1* | 3/2021 | Parry | G06F 11/1068 |
| 2022/0012121 | A1* | 1/2022 | Xu | G11C 29/72 |

* cited by examiner

VOLTAGE SCALING BASED ON ERROR RATE

PRIORITY INFORMATION

This application claims the benefits of U.S. Provisional Application No. 63/514,499, filed on Jul. 19, 2023, the contents of which are incorporated herein by reference.

TECHNICAL FIELD

Embodiments of the disclosure relate generally to memory sub-systems, and more specifically, relate to voltage scaling based on error rate.

BACKGROUND

A memory system can comprise a memory sub-system that can include one or more memory devices that store data, a digital logic, and an associated voltage control. The memory devices can be, for example, non-volatile memory devices and volatile memory devices. In general, a host system can utilize a memory sub-system to store data at the memory devices and to retrieve data from the memory devices and the voltage control can change a voltage during operation of the digital logic.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
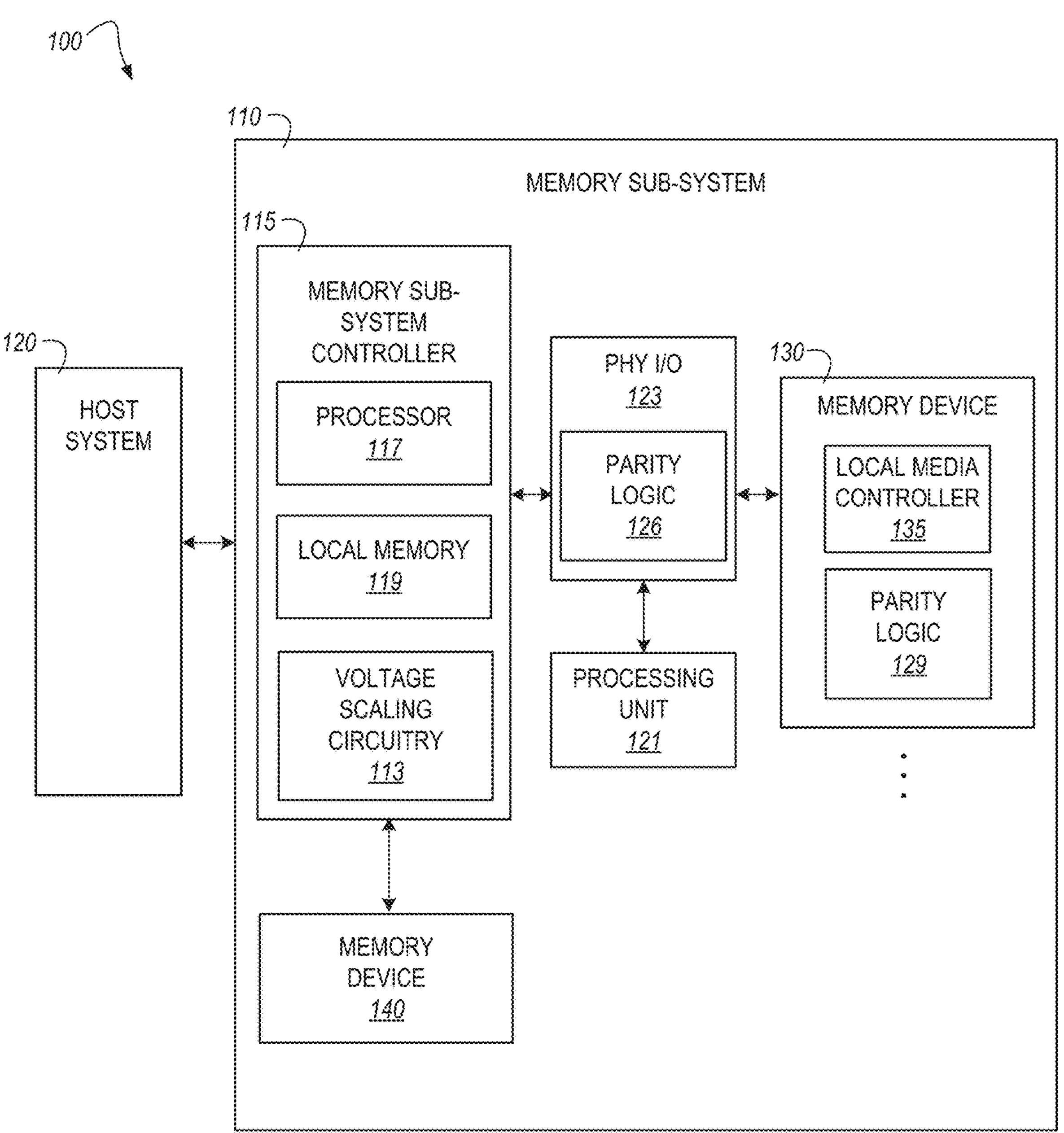
FIG. 1 illustrates an example computing system that includes a memory sub-system in accordance with some embodiments of the present disclosure.

Aspects of the present disclosure are directed to voltage scaling based on error rate, in particular to memory sub-systems that include circuitry to perform voltage scaling based on error rate (e.g., voltage scaling circuitry). Voltage scaling can be used to match system power consumption with desired performance. Error rates associated with a system (e.g., a computing system) can be monitored to determine a setting for a voltage value. Dynamic voltage adjustment is a technique that aims at reducing the power consumption of a system by dynamically adjusting the voltage of the system. This can exploit the fact that the system generally has a nominal voltage setting. Dynamic voltage scaling to increase voltage can be referred to as overvolting, whereas dynamic voltage scaling to decrease voltage can be referred to as undervolting. Undervolting can be performed in order to conserve power, particularly in computing systems such as laptops and other mobile devices, where energy comes from a battery and thus is limited, or, in some cases, to increase reliability of a computing system.

During operation of a computing system, data can incur errors while being transferred to and/or from a device and/or as a result of inherent characteristics of the device. For example, a fiber optic receiver or a radio that delivers data to a controller may have a percentage of data transferred which has been corrupted. In one embodiment, a memory device that includes a memory sub-system may encounter data corruption to a percentage of transferred data. A memory sub-system can be a storage system, storage device, a memory module, or a combination of such. An example of a memory sub-system is a storage system such as a solid-state drive (SSD). Examples of storage devices and memory modules are described below in conjunction with FIG. 1, et alibi. In general, a host system can utilize a memory sub-system that includes one or more components, such as memory devices that store data. The host system can provide data to be stored at the memory sub-system and can request data to be retrieved from the memory sub-system.

During operation data written to a memory sub-system can incur errors while being transferred to and from (e.g., when being written to, or read from) a memory device and/or as a result of inherent characteristics of the memory device. For example, NAND memory devices tend to introduce errors (e.g., flipped bits) to data stored thereby due to inherent behaviors of NAND memory devices, such as voltage drift, read/write disturbance, and/or memory cell degradation, among others. As a result, performance of a read operation may return bits from memory cells (e.g., NAND memory cells) that are different from bits written to the memory cells. For instance, a logical "0" written to a memory cell may be read as a logical "1," or vice versa. The rate of error caused by the memory device (e.g., bit-error-rate of the memory device and/or signal-to-noise ratio of the memory device) may fluctuate over time due to factors such as temperature, age of the memory device, utilization or workload of the memory device, etc. For example, because electrical current is utilized to provide power to the memory sub-system, the memory sub-system can exhibit temperature fluctuations during operation. Such fluctuations can become more pronounced based on the type of workload the memory sub-system is subject to. For example, some types of workloads that can be characterized by high volumes of operations can give rise to greater temperature fluctuations within the memory sub-system than workloads that are characterized by low volumes of operations, resulting in a higher memory device error rate. Further, a memory sub-system can experience temperature fluctuations based on the environment in which the memory sub-system is deployed. Additionally, over time and use, the quality of the memory sub-system can derogate yielding a higher error rate and a greater susceptibility to temperature and workload changes.

Additionally, as the memory sub-system interacts with the host system via a channel (or other interface, communication bus, etc.), errors can be encountered over the channel (e.g., bit-error-rate of the channel, a signal-to-noise ratio (SNR) of the channel). Channel error can be depending upon, but is not limited to, temperature of the memory sub-system and/or the environment, aging, voltage stabilities, and/or changes in frequency (e.g., speed). As one example, as a general rule, the faster the channel, the higher the bit-error-rate (BER), and accordingly, the slower the channel, the lower the BER. Additionally, tolerances within the system can affect channel error rate. For example, tolerances within on and off die terminations, I/O slope and driving strength of settings, internal PLL/DLL jitter requirements, internal analog and digital power supplies, as a non-limiting example, can affect the channel error rate. Therefore, the system may experience a total error rate of a combination between an error rate of the memory device (e.g., errors introduced during operation of the memory device) and an error rate encounter via the channel (e.g., errors introduced as a result of the data traversing the channel). When the error rate of the memory device is minimal, tolerances described above may be widened or voltage to the system may be reduced allowing for more errors encountered across the channel resulting in the need for less precision within components utilized in the system, a reduction in resources and a reduction in costs. However, the error rate of the memory device may, at times, be significant, requiring mitigation of the error rate of the channel.

The error rate of the channel can be mitigated in several non-limiting ways (e.g., tighter tolerances of the system, manipulation of I/O slew rate, termination, internal bias, reducing speed, or adjusting driving strength, pull-up/pull-down, attenuation/gain, clocking frequency and rate, etc.). In one example, the channel error rate can be mitigated by operating the channel at or above a particular voltage value, which can be referred to as the "nominal voltage value" of the channel (or interface, bus, etc.). For example, an error rate associated with the channel may change depending upon a voltage value supplied to the system. For example, the greater the voltage supplied to the system (e.g., to the channel) the lower the channel error rate. Given a sufficiently high voltage, the total error rate experienced between the memory device and the channel may be more than sufficient to adequately operate the system. For example, the system may be operating above or better than a targeted error rate level at such voltages. As such, some approaches employ a system that may utilize a voltage level (e.g., nominal voltage level) that operates the system above the targeted error rate level resulting in reduced overall efficiency of the system, increased power consumption, and/or increased thermal load experienced by the memory sub-system or components thereof.

Aspects of the present disclosure address the above and other deficiencies by determining whether the system is operating above a targeted error rate level, the total error rate of the system being the memory device error rate and the channel error rate. For example, appending parity to data read from the memory device to generate a bit string, transmitting the bit string to the host device via the channel, determining the bit-rate-error of the memory device and of the channel, comparing the actual total bit-rate-error (BER) to a targeted total bit-rate-error (BER), and adjusting the voltage of the system in response to the comparison to scale the voltage to a level that increases efficiency of the system and continues to yield an acceptable total error rate.

For example, embodiments herein can allow for dynamic control of the BER tolerated by the channel (e.g., a PHY I/O channel, such as an Open NAND Flash Interface (ONFI) channel) to reduce power consumption within a memory sub-system without negatively impacting performance of memory devices, such as NAND memory devices, that are utilized by the memory sub-system. As will be described in more detail herein, these and other aspects of the present disclosure can be realized by appending parity at the memory die level to data read from the memory device and comparing this parity with parity generated by circuitry coupled to the channel (e.g., by circuitry associated with an ONFI interface). These parities can be compared to determine the BER of the channel. When the actual total error rate mentioned above is less than or greater than the target total error rate, an amount of power provided to various components of the memory sub-system can be regulated altering the actual BER of the channel, and in turn altering the actual total error rate yielding increased efficiently while operating within the acceptable target total error rate.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via the same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random-access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130, 140 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 130 can be based on any other type of non-volatile memory or storage device, such as such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 can include voltage scaling circuitry 113. Although not shown in FIG. 1 so as to not obfuscate the drawings, the voltage scaling circuitry 113 can include various circuitry to facilitate regulating a voltage in response to a parity mismatch value between parity information generated by a parity logic 129 of a memory device 130 (memory parity information) and parity information calculated by parity logic 126 of the PHY I/O. As used herein, the term "parity mismatch value" generally refers to a condition in which one or more parity bits that are appended to a bit string and received from a memory device do not match parity bits (PHY I/O parity information) that are calculated by parity logic 126 of a PHY I/O. The parity mismatch value may indicate that one or more bits of the bit string may be in error. As will be appreciated, the PHY I/O can generally be an input/output (I/O) device of a physical (PHY) layer of the OSI of computing. In some embodiments, the PHY I/O can be an ONFI interface, although embodiments are not so limited. The parity logic 126 can be resident on the PHY I/O. As detailed further below, the term "resident on" refers to something that is physically located on a particular component.

In some embodiments, the voltage scaling circuitry 113 can include special purpose circuitry in the form of an ASIC, FPGA, state machine, and/or other logic circuitry that can allow the voltage scaling circuitry 113 to orchestrate and/or perform operations to selectively perform regulation of the voltage.

In some embodiments, the memory sub-system controller 115 includes at least a portion of the voltage scaling circuitry 113. For example, the memory sub-system controller 115 can include a processor 117 (processing device) configured to execute instructions stored in local memory 119 for performing the operations described herein. In some embodiments, the voltage scaling circuitry 113 is part of the host system 110, an application, or an operating system.

In a non-limiting example, an apparatus (e.g., the computing system 100) can include memory sub-system voltage scaling circuitry 113. The memory sub-system voltage scaling circuitry 113 can be resident on the memory sub-system 110. As used herein, the term "resident on" refers to something that is physically located on a particular component. For example, the memory sub-system voltage scaling circuitry 113 being "resident on" the memory sub-system 110 refers to a condition in which the hardware circuitry that comprises the memory sub-system voltage scaling circuitry 113 is physically located on the memory sub-system 110. The term "resident on" can be used interchangeably with other terms such as "deployed on" or "located on," herein.

The memory sub-system voltage scaling circuitry 113 can be configured to regulate and/or control regulation of voltage. Parity information can be generated by parity logic 129 of the memory device 130 and appended to data read from the memory components of the memory sub-system 110. As described above, the memory components can be memory dice (e.g., the memory dice 228 of FIG. 2) and/or memory packages that form at least a portion of the memory device 130. To detail further, the parity information generated by the parity logic 129 of the memory device 130 can be appended to data read from the memory device 130 to generate a bit string comprising the data read from the memory device 130 and the parity information generated by the parity logic 129. The bit string comprising the generated memory parity information and the data read from the memory device 130 can be received by the PHY I/O over a channel and compared to parity information calculated by the parity logic 126 of the PHY I/O. The memory sub-system voltage scaling circuitry 113 can regulate a voltage in response to a parity mismatch value between the received memory parity information and the calculated PHY I/O parity information.

The memory sub-system controller 115 can control transmission of the bit string, generated by memory device 130, to the PHY I/O 123 of the memory sub-system 110. The PHY I/O 123 (e.g., the processing unit 121 coupled to the PHY I/O 123) can be configured to calculate, for example, using the parity logic 126, a parity mismatch value. For example, the PHY I/O 123 (e.g., the processing unit 121 coupled to the PHY I/O 123) can be configured to compare the memory parity information received from the memory device 130 to the PHY I/O parity information calculated by the parity logic 126 to calculate the parity mismatch value. The PHY I/O 123 (e.g., the processing unit 121 coupled to the PHY I/O 123) can be further configured to determine an actual BER of a channel in which the bit string was transmitted across, where the actual BER of the channel is based on the calculated parity mismatch value. Further, as will be described in further detail below, the PHY I/O 123 can be configured to determine an actual BER for the at least one of the memory components based on a difference between the actual total BER of the system and the actual BER of the channel. In some embodiments, the actual BER of the at least one of the memory components and the actual BER of the channel, being the actual total BER of the system, may be compared to a targeted total BER to determine whether the actual total BER is below, above, or at the targeted total BER. As such, a voltage may be scaled (i.e., altered to increase or decrease the voltage value) in response to the comparison between the actual total BER and the targeted total BER of the system.

For example, in some embodiments, the PHY I/O 123 (e.g., the processing unit 121 coupled to the PHY I/O 123) can be configured to cause, based on determining that the actual total BER for the at least one of the memory components and the channel (e.g., the channel 224/324 illustrated in FIG. 2 and FIG. 3, herein) is below a threshold value of the targeted total BER, a voltage value to be scaled down. In some embodiments, the PHY I/O 123 (e.g., the processing unit 121 coupled to the PHY I/O 123) can be configured to cause, based on determining that the actual total BER for the at least one of the memory components and the channel is above a threshold value of the targeted total BER, a voltage value to be scaled up. In some embodiments, the PHY I/O 123 (e.g., the processing unit 121 coupled to the PHY I/O 123) can be configured to cause, based on determining that the actual total BER for the at least one of the memory components and the channel is within a threshold value of the targeted total BER, a voltage value to be maintained (i.e., remain unaltered).

By determining the comparison between the actual total BER and the targeted total BER and scaling the voltage supplied to the system based on the comparison, the channel error rate can be adjusted to result in an overall adjustment to the actual total BER. Adjusting the channel error rate can allow the system to operate at an acceptable error rate with minimal voltage supplied, increasing efficiency of the system and thereby providing an improvement to the overall function of computing systems in which aspects of the present disclosure are employed.

Figures 2, 3:
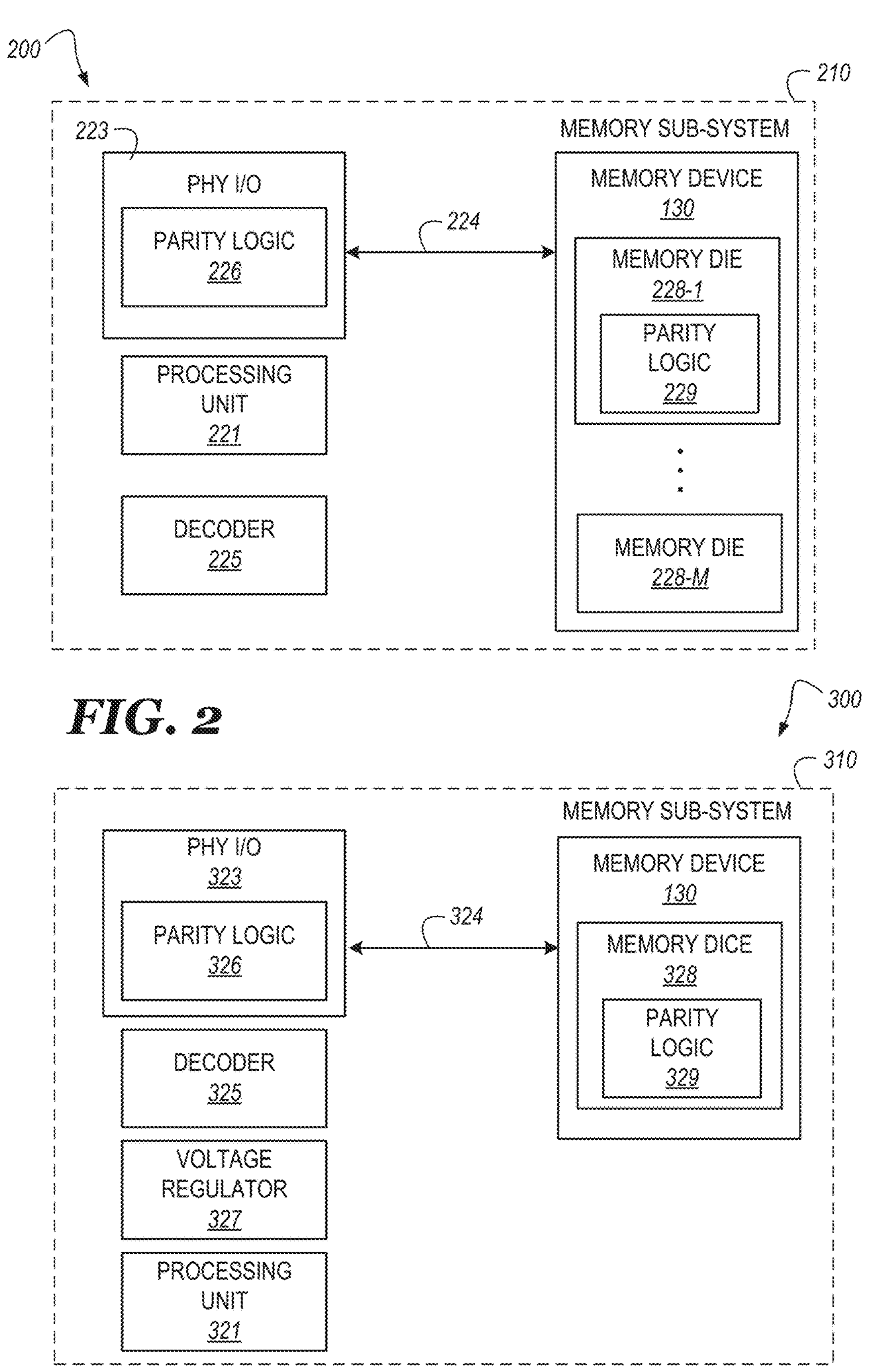
FIG. 2 illustrates an example apparatus for determining a parity mismatch value in accordance with some embodiments of the present disclosure.
FIG. 3 illustrates an example apparatus for voltage scaling based on error rate in accordance with some embodiments of the present disclosure.

FIG. 2 illustrates an example apparatus 200 for calculating a parity mismatch value in accordance with some embodiments of the present disclosure. The apparatus can include a memory subsystem 210 that includes parity logic 229. The memory sub-system 210 can include a plurality of memory dice 228-1 to 228-M (referred to in general as "memory dice 228"). In contrast to previous approaches, the parity logic 229 can be resident on at least one of the plurality of memory dice 228. Alternatively, the parity logic 229 can be resident on the memory device, outside the plurality of memory dice 228 (e.g., parity logic 129 as shown in FIG. 1). The parity logic 229 can include hardware (e.g., circuitry) that is configured to generate and/or append parity bits (e.g., concatenate parity information) on bit strings read from the memory device 130 and therefore bit strings read from the memory dice 228. In some instances, the plurality of memory dice 228 can be resident on a NAND memory device 130 and/or the parity logic 229 can be resident on one or more of the memory dice 228.

In some embodiments, the parity logic 229, resident on the memory sub-system 210, the memory device 130, and/or the memory dice 228 of the memory device 130, can be configured to generate parity information. As mentioned above, the parity logic 229 may further be configured to concatenate the parity information generated by the parity logic 229 to a codeword read from one of the plurality of memory dice 228 to generate a bit string. The codeword can include host data (e.g., user data, etc.) and/or an element of an error-correcting code. In general, a "codeword" refers to a bit string that contains a predetermined quantity of bits that may include data (e.g., a payload), error correction bits (e.g., parity), a header (e.g., one or more bits describing the purpose of the bit string), and/or an address locator (e.g., an address from which or to which the bit string is to be written or to be retrieved). The bit string can include the codeword and the concatenated parity information. The parity logic 229 can be configured to further cause the bit string to be transferred to circuitry external to the plurality of memory dice 228. For example, the circuitry external to the plurality of memory dice 228 can comprise a physical input/output (PHY I/O) 223 device that is couplable to the plurality of memory dice 228 via a channel 224. The PHY I/O 223 can receive the bit string from the memory device 130 via the channel 224. As mentioned above, the channel 224 can be a channel of an interface, such as an ONFI interface, a bus, or similar collection of channels configured to facilitate transfer of data, such as bit strings between the PHY I/O 223 and the memory device 130.

A decoder 225 can be coupled to the PHY I/O 223 and/or the memory device 130. The decoder 225 can be a Low-Density Parity-Check (LDPC) decoder 225, which can include firmware and/or hardware, configured to decode the codeword. Decoding the codeword can be part of a read operation. Decoded data, yielded from decoding the codeword, can be used to determine an actual total number of errors received from the memory device 130. For example, performance of the read operation may return bits from memory cells (e.g., NAND memory cells) that are different from bits written to the memory cells. For instance, a logical "0" written to a memory cell may be read as a logical "1," or vice versa. Additionally, the channel 224 over which the bit string is transferred can cause errors during the transfer of data between the memory device 130 and the PHY I/O 223. An actual total BER of the system can, therefore, include the actual BER of the memory dice in addition to the actual BER of the channel. The actual BER of the channel can be determined based on a calculated parity mismatch value, as discussed above.

For example, the PHY I/O 223 (e.g., a processing unit 221 coupled to the PHY I/O 223) may be configured to calculate PHY I/O parity information, using, for example, the parity logic 226. The PHY I/O 223 (e.g., the processing unit 221 coupled to the PHY I/O 223) may be further configured to receive the bit string including the memory parity information from the memory device 130 (and the data read from the memory device 130) and compare the calculated PHY I/O parity information to the received memory parity information to calculate a parity mismatch value based on bit values contained within the received bit string. The PHY I/O 223 can then be utilized to determine an actual BER of the channel based on the calculated parity mismatch value.

FIG. 3 illustrates an example apparatus 300 for voltage scaling based on error rate in accordance with some embodiments of the present disclosure. The apparatus 300 can be analogous to the apparatus 200 illustrated in FIG. 2 and, accordingly, elements illustrated in FIG. 3 with similar names to those of FIG. 2 can be analogous to one another. The apparatus can include a physical input/output (PHY I/O) device 323 including a parity logic 326. The PHY I/O can be coupled to a decoder 325 (e.g., a low-density parity-check (LDPC) decoder), a processing unit 321 and/or a voltage regulator 327.

In some embodiments the processing unit 321, coupled to the PHY I/O device 323 and utilizing the parity logic 326 of the PHY I/O device 323 can receive memory parity information corresponding to a bit string received by the PHY I/O device 323. The bit sting can be received via a channel 324. In not so limiting examples, the bit string can be received via a channel 324 that is associated with an Open NAND Flash Interface (ONFI) interface or other type of bus.

The processing unit 321 can be configured to calculate PHY I/O parity information utilizing the parity logic 326 of the PHY I/O device 323. The calculated PHY I/O parity information can be compared to the memory parity information generated and appended to the bit string by the parity logic 329. The processing unit 321 can further be configured to calculate a parity mismatch value that is based on a comparison between the calculated PHY I/O parity information and the received memory parity information. The calculated PHY I/O parity information can be different from the received memory parity information due to errors encountered when transmitting and receiving data over the channel 324. The difference between the calculated PHY I/O parity information and the received memory parity information, generated and transferred from the memory device 130, being the calculated parity mismatch value. The processing unit 321 can be configured to, based on the calculated parity mismatch value, determine an actual channel error rate and regulate a voltage in response to the actual channel error rate versus a target channel error rate.

For example, the processing unit 321 can be configured to determine a target parity mismatch value. The target parity mismatch value may indicate the target channel error rate. The target parity mismatch value can be determined from subtracting an actual memory device error rate from a targeted or threshold total target error rate (e.g., an acceptable performance level of the memory device) determined by the processing unit 321. The processing unit 321 can be configured to calculate the actual memory device error rate. For example, the processing unit 321 can utilize the decoder 325, coupled to the PHY I/O 323 and the processing unit 321, to determine the actual total BER (e.g., actual error rate of the memory device and actual error rate encounter via the channel) of the data received from the memory device 130. The parity logic 326 of the PYH I/O 323 can be utilized to determine the actual BER, encountered by the channel, of the data read from the memory device 130. Processing unit 321 can further calculate the difference between the actual total BER that was determined utilizing the decoder 325 and the actual channel BER that was determined utilizing the parity logic 326 to determine the actual BER of the memory device 130. As such, the processing unit 321 can calculate the target parity mismatch value from the difference between the targeted or threshold total error rate and the actual BER of the memory device 130.

The target parity mismatch value can be dynamic based on the actual BER encountered by the memory device 130. When the actual BER of the memory device 130 is nearly error free (i.e., a low error rate), the voltage can be decreased, allowing a higher error rate across the channel. Accordingly, as the memory device 130 degrades over time, the error rate of the memory device 130 can increase. As such, when the actual BER of the memory device 130 increases closer to the targeted or threshold total error rate (i.e., toward a high error rate), the voltage can be increased to minimize the actual BER encountered over the channel. In this way, the actual total BER can be maintained at or near the targeted or threshold total error rate.

Further, the BER of the memory device 130 fluctuates over the life of the memory device 130 due to various circumstances such as fluctuations in temperatures, types of workloads, and derogation of the quality of the memory sub-system, though examples are not so limited. As such, the actual total BER (e.g., the actual BER of the channel combined with the actual BER of the memory device) will fluctuate due to the changing quantity of errors exhibited from the memory device 130 throughout the life and operation of the memory device 130. As such, the difference between the targeted or threshold total error rate and the actual BER of the memory device will change depending on various aspects of operation within the memory sub-system 310. To accommodate these changes so as to maintain an optimal efficiency and yield an acceptable total error rate, the processing unit 321 can be configured to determine changes in the target parity mismatch value (e.g., acceptable BER of the channel). In this way, the target parity mismatch value can be a roaming or dynamic parity mismatch value.

The PHY I/O device 323 may be further coupled to a voltage regulator 327. The processing unit 321 can be configured to regulate the voltage, utilizing the voltage regulator 327, by altering a voltage value from a first voltage value to a second voltage value in response to a comparison between the calculated parity mismatch value and the target parity mismatch value. As stated above, as the actual BER of the memory device 130 fluctuates over time and operation of the memory sub-system 130 the target parity mismatch value changes. As a result, the processing unit 321 can be configured to further alter the voltage value in response to a comparison between the calculated parity mismatch value and the roaming parity mismatch value. Put another way, the voltage can depend on the actual total error rate and can be regulated as the actual total error rate fluctuates in order to cause an optimal BER of the channel.

For example, in embodiments in which the channel 324 is provided as part of an ONFI bus (e.g., interface), the ONFI bus may operate at a nominal voltage associated with the ONFI bus. This nominal voltage may yield a minimal channel error rate, however, as discussed herein, the nominal voltage may be greater than necessary to operate the memory sub-system 310 while maintaining an actual total BER that is within acceptable error thresholds. In the situation where the calculated parity mismatch value is below the target parity mismatch value, the system is operating at a higher or "better" than required state than is required to maintain an acceptable BER. Reducing the voltage can cause the actual channel error rate to increase. However, in this example, an increase in the actual channel error rate is acceptable since the calculated parity mismatch value is below the target parity mismatch value. The voltage can be reduced, thereby reducing power consumption and adverse thermal effects on the memory sub-system 310 while increasing efficiency of the memory sub-system 310.

For example, the first voltage value can be the nominal voltage associated with the ONFI bus and the second voltage value can be less than the first voltage value. In the situation where the calculated parity mismatch value is below the target parity mismatch value, the processing unit 321 can be configured to cause the voltage regulator 327 to adjust the voltage from the first voltage value (nominal ONFI bus voltage value) to the second voltage value (less than the nominal voltage value). In the situation where a calculated parity mismatch value is still below the target parity mismatch value after the voltage has been adjusted from the first voltage value to the second voltage value, the processing unit 321 can be configured to cause the voltage regulator 327 to regulate the voltage by altering the voltage value from the second voltage value to a third voltage value, the third voltage value being less than the first voltage value and less than the second voltage value.

In the situation where a calculated parity mismatch value is equal to or within a determined threshold range of the target parity mismatch value, the processing unit 321 can be configured to cause the voltage regulator 327 to maintain a voltage value. Although three voltage values are described, the scope of the disclosure further contemplates the usage of greater than three voltage values to provide additional fine tuning to the voltage value that is selected during operation of the memory sub-system 310. Further, it is contemplated within the scope of the disclosure that, based on calculated parity mismatch values in real time, the voltage value can be dynamically altered by, for example, increasing the voltage value from the third voltage value to the second voltage value, increasing the voltage value from the second voltage value to the nominal voltage value, and so on and so forth.

In an illustrative non-limiting example, the nominal voltage may be used when it is determined that the actual total BER of the channel 324 and the memory device 130 is greater than $6\times10^{-3}$ to minimize errors introduced by the channel 324. This is because the memory device 130 is introducing so many errors that any reduction in the amount of errors introduced by the channel 324 will be beneficial to ensure accurate data retrieval. In contrast, if the actual total BER of the channel 324 and the memory device 130 is less than $4\times10^{-3}$, the lowest voltage (e.g., the third voltage value)

can be applied to the PHY I/O 323 to conserve resources within the memory sub-system 310 and to improve the efficiency of the memory sub-system 310. This is because the memory device 130 is introducing an amount of errors that is below a threshold error rate (e.g., the memory device 130 is generally providing data that has a minimized quantity of errors associated therewith) and therefore the introduction of some additional errors by the channel 324 is acceptable, particularly due to the benefit of reduced power consumption, higher or "better" thermal performance, etc. that can be experienced by the memory sub-system 310 as a result of reduction in voltage applied to the PHY I/O 323. Continuing with this example, if the actual total BER of the channel 324 and the memory device 130 is between $4\times10^{-3}$ and $6\times10^{-3}$, a lowered voltage (e.g., the second voltage) may be applied to the PHY I/O 323. This can allow for resources, such as power, to be conserved in comparison to application of the nominal voltage while still providing data that does not suffer from too great a quantity of errors. It will be appreciated that the foregoing numerical examples are merely illustrative and are not to be taken as limiting the scope of the disclosure to these particular enumerated values. Further, though three zones are described, it is within the scope of the disclosure that more or less zones are contemplated, that zones may be divided differently, and/or zones may be completely contiguous.

Figure 4:
FIG. 4 illustrates an example method diagram for determining a parity mismatch value in accordance with some embodiments of the present disclosure.
Figure 4:
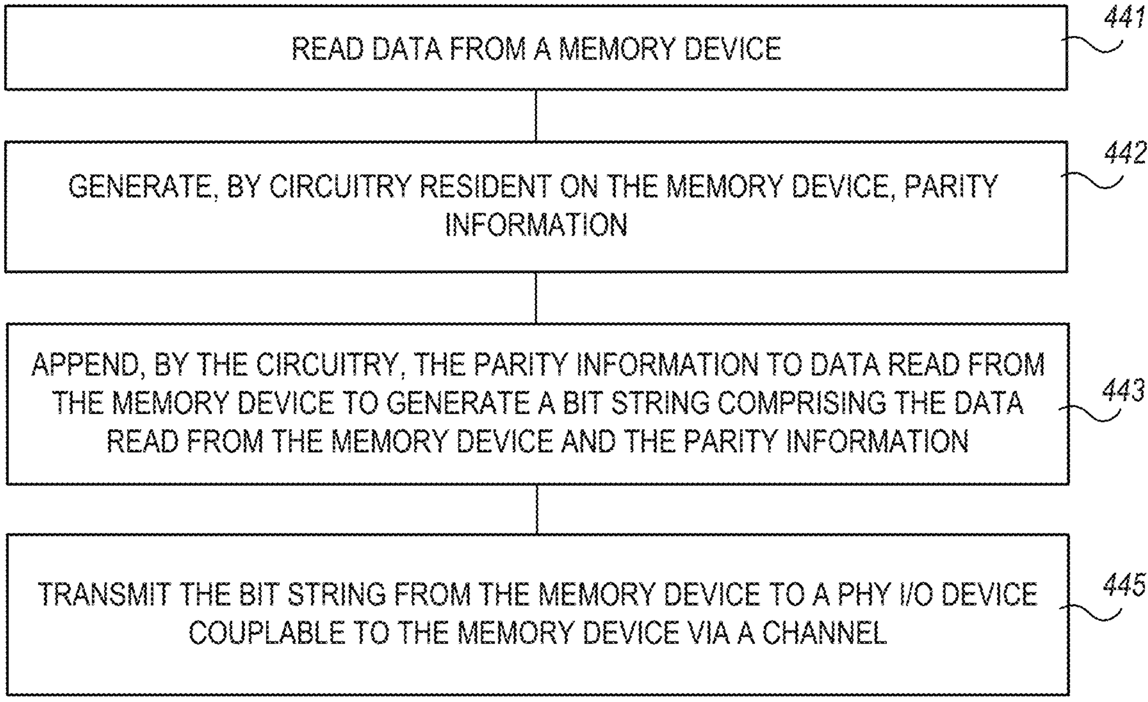

FIG. 4 illustrates an example method diagram 440 for calculating a parity mismatch value in accordance with some embodiments of the present disclosure. The method 440 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 440 is performed by the memory sub-system circuitry 210 of FIG. 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 441, data can be read from a memory device. The data can be read from the memory device in response to a read operation.

At operation 442, parity information can be generated by circuitry resident on the memory device. The circuitry resident on the memory device can be resident outside of or in a memory die associated with the memory device. The parity information can be generated on the memory die, for example by the parity logic 229/329 illustrated in FIG. 2 and FIG. 3, herein. In some embodiments, the parity information can be generated without enabling a memory controller (e.g., the memory sub-system controller 115 of FIG. 1) coupled to the memory device (e.g., the memory device 130 illustrated in FIGS. 1-3).

At operation 443, the parity information can be appended to the data read from the memory device to generate a bit string. The bit string can be comprised of the data read from the memory device and the parity information. The parity information can be appended to the data read from the memory device by the parity logic 229/329 illustrated in FIG. 2 and FIG. 3. For example, the parity information can be appended to the data read from the memory device to generate the bit string without enabling the memory controller coupled to the memory device.

In some embodiments, the data read from the memory device can comprise a codeword. The codeword can include host data (e.g., user data, etc.) and/or an element of an error-correcting code. In general, a "codeword" refers to a bit string that contains a predetermined quantity of bits that may include data (e.g., a payload), error correction bits (e.g., parity), a header (e.g., one or more bits describing the purpose of the bit string), and/or an address locator (e.g., an address from which or to which the bit string is to be written or to be retrieved). Further, the data read from the memory device can comprise multiple codewords (e.g., 5, 10, etc.) In some embodiments, appending parity information to the data read from the memory device can comprise appending respective parity information to a plurality of respective data read from the memory device to generate a plurality of bit strings that include the parity information. That is, the plurality of bit strings can comprise the respective data read from the memory device and the respective parity information. The respective parity information can be appended to the plurality of respective data read from the memory device by the parity logic 229/329 illustrated in FIGS. 2 and 3. In some embodiments, the parity information can be concatenated on the data to yield a bit string that is read from the memory device.

At operation 445, the bit string (or the plurality of bit strings) can be transmitted (e.g., read) from the memory device. The bit string can be transmitted to a physical input/output (PHY I/O) device that is couplable to the memory device via a channel, such as the channels described above in connection with FIG. 2 and FIG. 3. Circuitry (e.g., the parity logic 226/326 illustrated in FIGS. 2-3, herein), resident on the PHY I/O device, can calculate a parity mismatch value based on bit values contained within the bit string. An actual BER, associated with the channel, can be determined by the circuitry resident on the PHY I/O device and a processing unit based on the calculated parity mismatch value. An actual BER, associated with the memory device, can be determined by the circuitry resident on a decoder, the PHY I/O device, and the processing unit based on the total decoded error rate and the actual BER of the channel (e.g., the calculated parity mismatch value).

Figure 5:
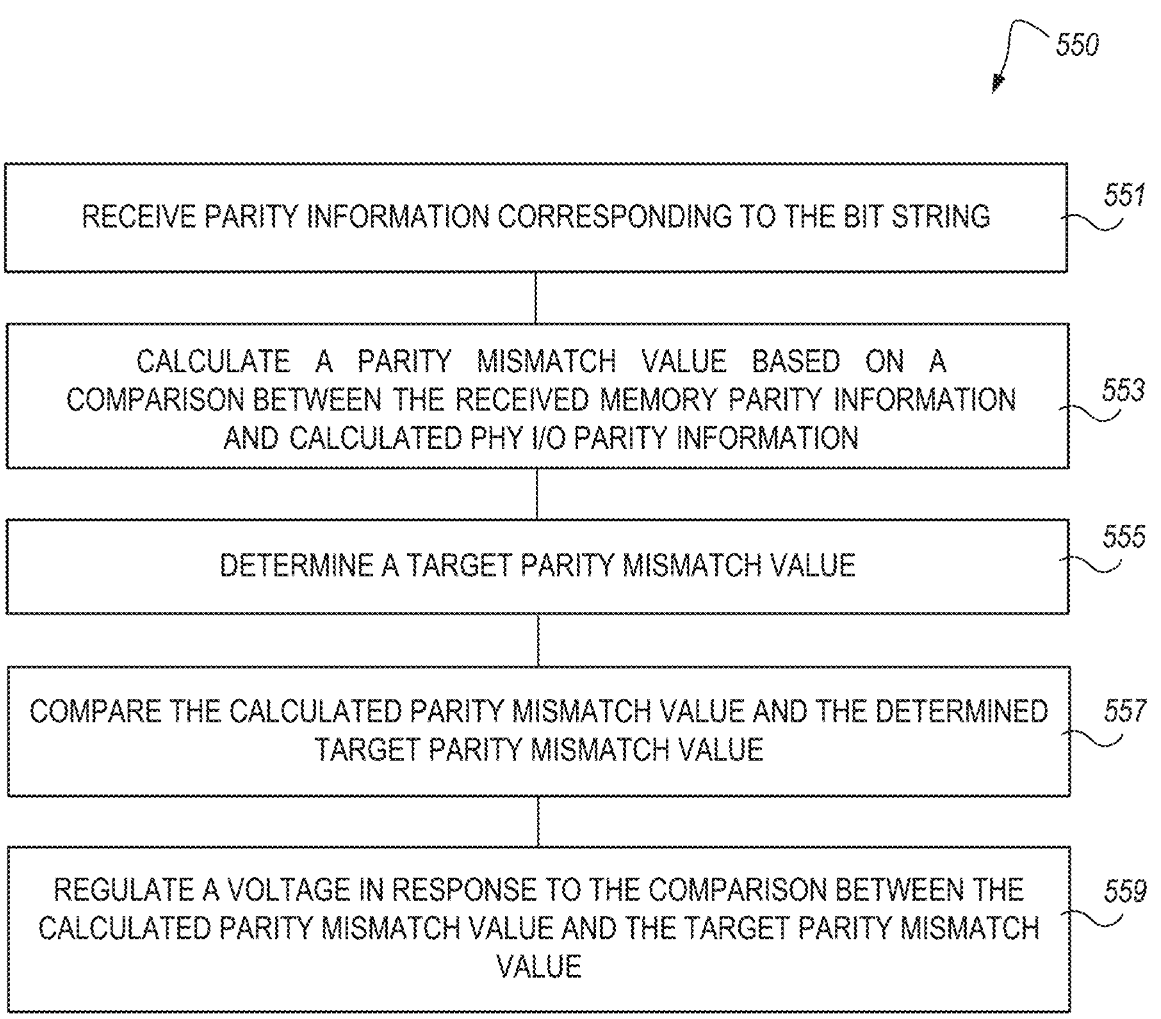
FIG. 5 illustrates an example method diagram for voltage scaling based on error rate in accordance with some embodiments of the present disclosure.

FIG. 5 illustrates an example method diagram 550 for voltage scaling based on error rate in accordance with some embodiments of the present disclosure. The method 550 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 550 is performed by the physical input/output (PHY I/O) device 123 of FIG. 1, for example by the processing unit 221 and 321 of FIG. 2 and FIG. 3. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 551, the PHY I/O device receives parity information corresponding to the bit string. The bit string can be received (e.g., read) from a memory device coupled to the PHY I/O device via an Open NAND Flash Interface (ONFI) channel.

At operation 553, a parity mismatch value can be calculated based on a comparison between the received memory parity information (e.g., the parity information generated by the memory device including any errors encountered by the channel) and the calculated PHY I/O parity information (e.g., the parity information calculated by the PHY I/O). The received memory parity information (and/or the received data) generally includes errors introduced by the channel. The calculated parity mismatch value is equal to or based on the difference between the calculated PHY I/O parity information and the received memory parity information. Utilizing the calculated parity mismatch value, an actual channel error rate can be determined. Further, utilizing the calculated parity mismatch value, an actual memory device error rate can be determined. For example, a decoder coupled to the PHY I/O and/or the memory device can be utilized to decode a codeword received from (e.g., read from) the memory device to determine an actual total error rate of the memory sub-system. The actual memory device error rate can be calculated from the difference between the actual total memory sub-system error rate and the actual channel error rate.

At operation 555, a target parity mismatch value can be determined. The target parity mismatch value can be associated with an acceptable amount of or an acceptable range of errors or BER encountered as data is transferred over the channel.

At operation 557, the calculated parity mismatch value and the determined target parity mismatch value can be compared. For example, the calculated parity mismatch value may be determined to be higher than the target parity mismatch value. Correspondingly, the target parity mismatch value may be determined to be higher than the calculated parity mismatch value. Alternatively, the calculated parity mismatch value may be within the acceptable range of error of the target parity mismatch value.

At operation 559, a voltage can be regulated in response to the comparison between the calculated parity mismatch value and the target parity mismatch value. For example, in response to the calculated parity mismatch value being higher than the target parity mismatch value by a first threshold amount, the voltage may be regulated by increasing the voltage. Increasing the voltage can result in a lower actual BER for the channel, reducing the actual overall total errors in the system and reducing the parity mismatch value between the received memory parity information and the calculated PHY I/O parity information. Correspondingly, in response to the target parity mismatch value being higher than the calculated parity mismatch value by a second threshold amount, the voltage may be regulated by decreasing the voltage. Decreasing the voltage can result in a higher actual BER for the channel, increasing the actual overall total errors in the system and increasing the parity mismatch value between the received memory parity information and the calculated PHY I/O parity information. Additionally, reducing the voltage can result in a reduction in resources and a higher efficiency of the system.

In some embodiments, the calculated parity mismatch value can be within a threshold range of the target parity mismatch value. In this example, in response to the calculated parity mismatch value being within the threshold range of the target parity mismatch value, regulating the voltage can comprise maintaining a current voltage value. The first threshold amount, the second threshold amount, and the threshold range can be predetermined and configured by the processing device coupled to the PHY I/O device.

Figure 6:
FIG. 6 illustrates an example system that includes a memory device and a PHY I/O in accordance with some embodiments of the present disclosure.
Figure 6:
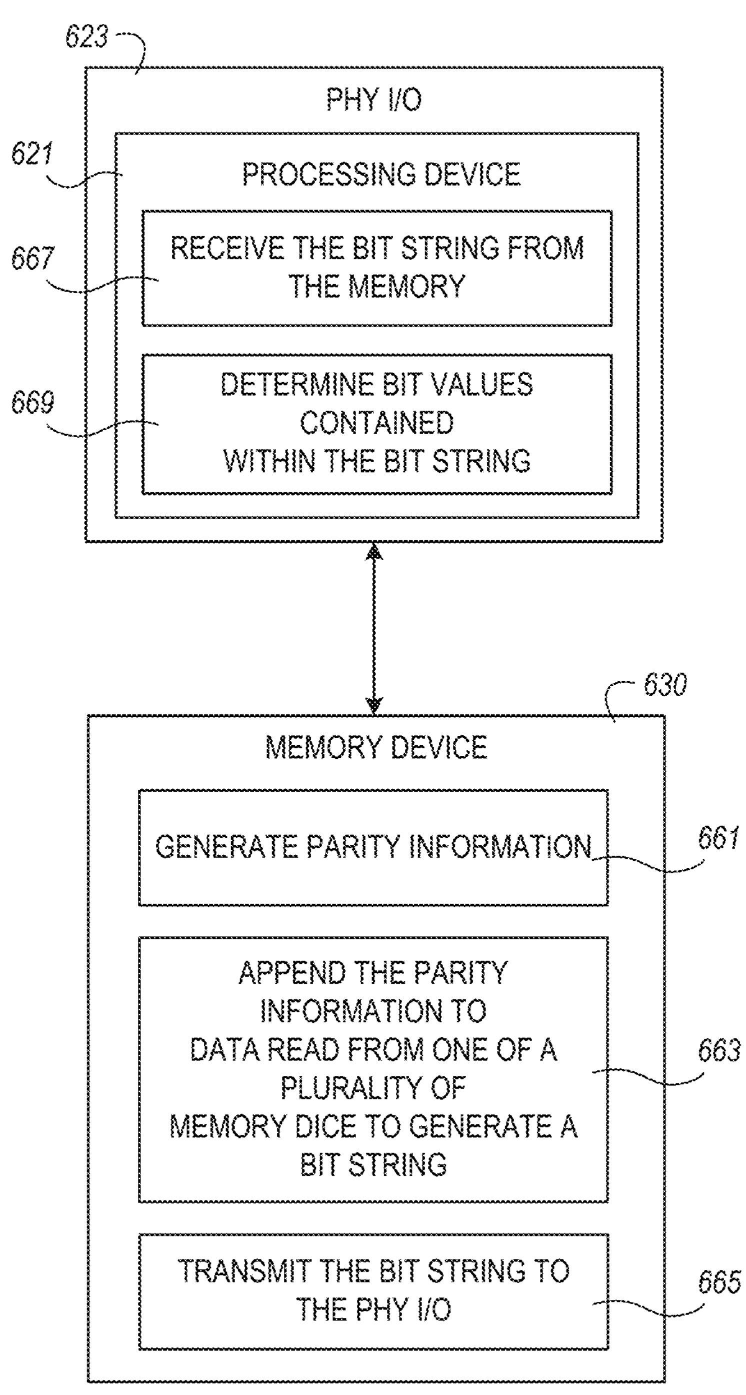

FIG. 6 illustrates an example system 660 that includes a memory device 630 and a PHY I/O 623 in accordance with some embodiments of the present disclosure. The memory device 630 can be couplable to a physical input/output (PHY I/O) device 623 and a processing device 621 via a channel and can comprise a plurality of memory dice.

At operation 661, of the system 660, the memory device 630 can be configured to generate parity information. The parity information can be generated by circuitry resident on at least one of the plurality of memory dice (e.g., in one of several dices, in multiple dices, or per dice) of the memory device 630. In some embodiments, the parity information can be generated without enabling a memory controller coupled to the memory device 630.

At operation 663 of the system 660, the generated parity information can be appended to data read from one or more of the plurality of memory dice to generate a bit string. The parity information can be appended utilizing memory sub-system parity circuitry such as the memory sub-system parity logic circuitry 229/329 illustrated in FIGS. 2-3. The circuitry can be resident on one or more of the plurality of memory dice and can be appended to the data read from one or more of the plurality of memory dice to generate the bit string without enabling the memory controller coupled to the memory device 630. The generated bit string can comprise the data read from the one or more of the plurality of memory dice and the generated parity information. In some embodiments, the parity information can be concatenated to a codeword read from one or more of the plurality of memory dice and the generated bit string can further include the codeword.

At operation 665 of the system 660, the bit string, including the data read from the one or more of the plurality of memory dice and the parity information, can be transmitted from the memory device 630 to the PHY I/O device 623 via the channel. In some embodiments, the channel can be an Open NAND Flash Interface (ONFI) bus.

At operation 667 of the system 660, the bit string transmitted from the memory device 630 can be received by the PHY I/O device 623. The PHY I/O device 623 can be coupled to the processing device 621 that is configured to receive the bit string over the channel (ONFI bus). The PHY I/O device 623 can receive the codeword included in the bit string and, utilizing a decoder coupled to the PHY I/O device 623, decode the codeword.

At operation 669 of the system 660, the processing device 621 coupled to the PHY I/O device 623 can be configured to determine bit values contained within the bit string. Based on the bit values determined to be contained within the bit string, the processing device 621 can be further configured to calculate a parity mismatch value. Calculating the parity mismatch value can comprise a comparison of the bit values contained within the parity information in the bit string (e.g., memory parity information) to calculated PHY I/O parity information calculated by circuitry, such as the parity logic circuitry 226/326 illustrated in FIGS. 2-3. Further, the processing device 621 can be configured, utilizing the decoder, to decode a codeword received by the PHY I/O 623 from the memory device 630 to determine an actual total error rate of the system 660.

Utilizing the calculated parity mismatch value, the processing device 621 can be configured to determine an actual BER associated with the channel based on the calculated parity mismatch value. Further, the processing device 621 can be configured to calculate a difference between the actual total error rate of the system 660 and the actual BER of the channel to determine an actual BER associated with the plurality of memory dice.

Figure 7:
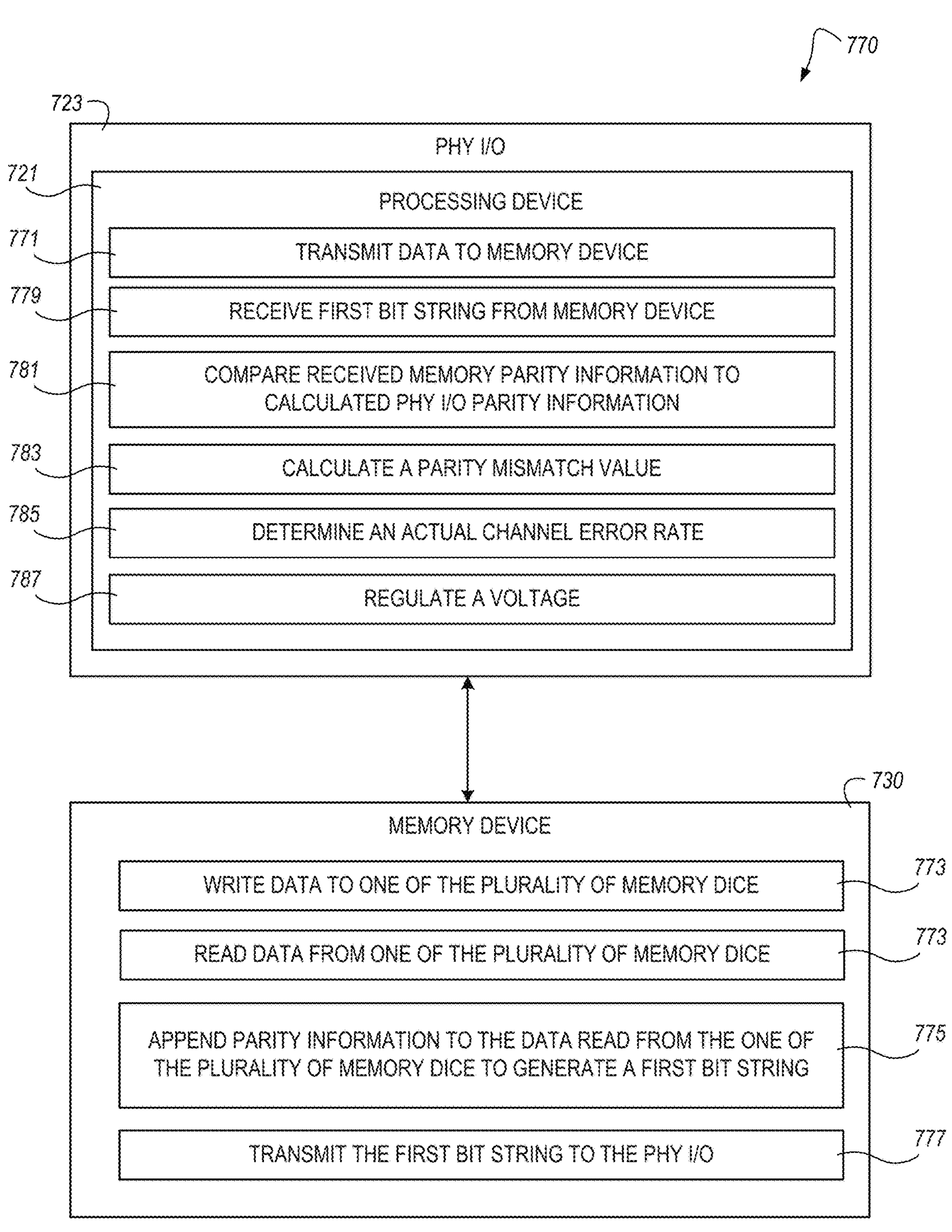
FIG. 7 illustrates an example system that includes a memory device and a PHY I/O in accordance with some embodiments of the present disclosure.

FIG. 7 illustrates an example system 770 that includes a memory device 730 and a PHY I/O 723 in accordance with some embodiments of the present disclosure. The memory device 730 can be couplable to the physical input/output (PHY I/O) device 723 via a channel and can comprise a plurality of memory dice.

At operation 771 of the system 770, a processing device 721 coupled to the PHY I/O device 723 can be configured to transmit data from the PHY I/O device 723 to the memory device 730 included in the system 770. The memory device 730 can store the data for later use by the PHY I/O device 723 or another device couplable to the memory device 730 and/or the system 770.

At operation 773 of the system 770, circuitry resident on at least one of the memory dice of the memory device 730 can be configured to write the data received from the PHY I/O device 723 to one of the plurality of memory dice. The data can be stored on the memory device 730 for later use by the PHY I/O device 723 or another device couplable to the memory device 730 and/or the system 770. The data written to the memory dice can become partially corrupted and can include errors introduced to the data by the memory dice.

At operation 774 of the system 770, the system 770 can be configured to read the data from the one of the plurality of memory dice.

At operation 775 of the system 770, circuitry resident on at least one of the memory dice can be configured to append parity information, generated by the circuitry, to the data read from the one of the plurality of memory dice to generate a first bit string. The first bit string can comprise the read data and the parity information appended to the data. In some embodiments the memory device 730 can be a NAND memory device. In this example, the NAND memory device can append the parity information on to the bit string. In some embodiments, the bit string can comprise at least one codeword.

At operation 777 of the system 770, circuitry resident on at least one of the memory dice can be configured to transmit the first bit string to the PHY I/O device 723 via the channel. The channel can comprise an Open NAND Flash Interface (ONFI) bus, though examples are not so limited.

At operation 779 of the system 770, the PHY I/O device 723 can receive the first bit string from the memory device 730 via the channel. The first bit string can comprise the data previously transmitted to the memory device 730 from the PHY I/O device 723 at operation 771. The first bit string can further comprise memory parity information appended to the data and transmitted from the memory device 730 to the PHY I/O device 723 of the system 770.

At operation 781 of the system 770, the processing device 721 resident on the system 770 and coupled to the PHY I/O device 723, can be configured to calculate PHY I/O parity information. The processing device 721 can be further configured to receive memory parity information and compare the memory parity information to the calculated PHY I/O parity information.

At operation 783 of the system 770, the processing device 721 resident on the system 770 and coupled to the PHY I/O device 723 can be configured to calculate a parity mismatch value based on the comparison between the memory parity information and the calculated PHY I/O parity information.

At operation 785 of the system 770, the processing device 721 resident on the system 770 and coupled to the PHY I/O device 723 can be configured to determine an actual channel error rate based on the calculated parity mismatch value. As further described below, the actual channel error rate can be adjusted depending upon the voltage supplied to the system. The greater the voltage utilized, the lower the actual channel error rate and vice versa.

Further, as illustrated in FIG. 2 and FIG. 3, the PHY I/O device 723 can be coupled to a decoder resident on the system 770. In some examples, the decoder can be a Low-Density Parity-Check (LDPC) decoder. The processing device 721 can be configured, utilizing the LDPC decoder, to decode the codeword received over the channel from the memory device 730 to determine an actual total error rate of the system 770. For example, the received data can include information about the data previously written to and read from (e.g., received from) the memory device 730, including any partially corrupted data and errors introduced to the data by the memory dice. Further, the received data can include errors introduced into the data and into the system 770 while the data was transmitted from the memory device 730 to the PHY I/O device 723 over the channel. The processing device 721 can be further configured to calculate an actual memory device error rate based on a difference between the actual total error rate and the actual channel error rate.

In some embodiments, the processing device 721 can be further configured to determine a target parity mismatch value (e.g., an acceptable error rate). The target parity mismatch value, calculated by the processing device 721, can be associated with a difference between a target total BER of the system 770 that allows the system 770 to operate at a highest or best efficiency rate and still yield an acceptable total BER and the calculated memory device error rate.

At operation 787 of the system 770, the processing device 721 resident on the system 770 and coupled to the PHY I/O device 723 can be configured to regulate a voltage in response to the calculated parity mismatch value. For example, the PHY I/O device 723 can be coupled to a voltage regulator as illustrated in FIG. 3, and the processing device 721 can be configured to compare the target parity mismatch value to the calculated parity mismatch value, and in response to the comparison, utilize the voltage regulator to alter the voltage supplied. Altering the voltage can result in changing the actual BER of the channel. For example, increasing the voltage can reduce errors encountered by the channel and decreasing the voltage can increase errors encountered by the channel. If the calculated parity mismatch value is higher than the target parity mismatch value by a specified amount, or by a first threshold amount for example, the processing device 721 can be configured to cause the voltage regulator to increase the voltage. Correspondingly, if the target parity mismatch value is higher than the calculated parity mismatch value by a specified amount, or by a second threshold amount for example, the processing device 721 can be configured to cause the voltage regulator to decrease the voltage. Decreasing the voltage minimizes resources and increases efficiency of the system, providing improvement to the overall function of the computing system.

In some embodiments, the voltage supplied may start with a nominal voltage value. For example, the voltage may be a nominal voltage value associated with an Open NAND Flash Interface (ONFI) bus. Regulating the voltage can comprise altering the voltage from the nominal voltage to a second voltage lower than the nominal voltage value. The voltage value may be altered to the second voltage value in response to the target parity mismatch value being higher than the calculated parity mismatch value by at least the second threshold amount. When the voltage is changed to the second voltage value a second bit string may be transmitted from the memory device 730 to the PHY I/O device 723. The processing device 721 can be configured to calculate a parity mismatch value between the received second bit string and a calculated second parity value associated with the second bit string. As such, the processing device 721 can be configured to regulate the voltage to alter the actual channel error rate, altering a parity mismatch value between parity information received by the PHY I/O device 723 from a second bit string transmitted from the memory device 730.

In some examples, the calculated parity mismatch value can exceed or become higher than the target parity mismatch value. If the calculated parity mismatch value is higher than the target parity mismatch value by at least the first threshold amount the voltage may be altered back from the second voltage value to the nominal voltage value, increasing the voltage supplied. Increasing the voltage can reduce the actual BER of the channel and lower the overall error rate or the parity mismatch value between the calculated PHY I/O parity information and the received memory parity information. In some embodiments, in response to the calculated parity mismatch value being within a threshold range, not being higher than the first threshold or the second threshold of the target parity mismatch value, the processing device 721 may be configured to regulate the voltage by maintaining a voltage value. Thus, the PHY I/O device 723 voltage can be dynamically controlled for an improved power/performance combination.

Figure 8:
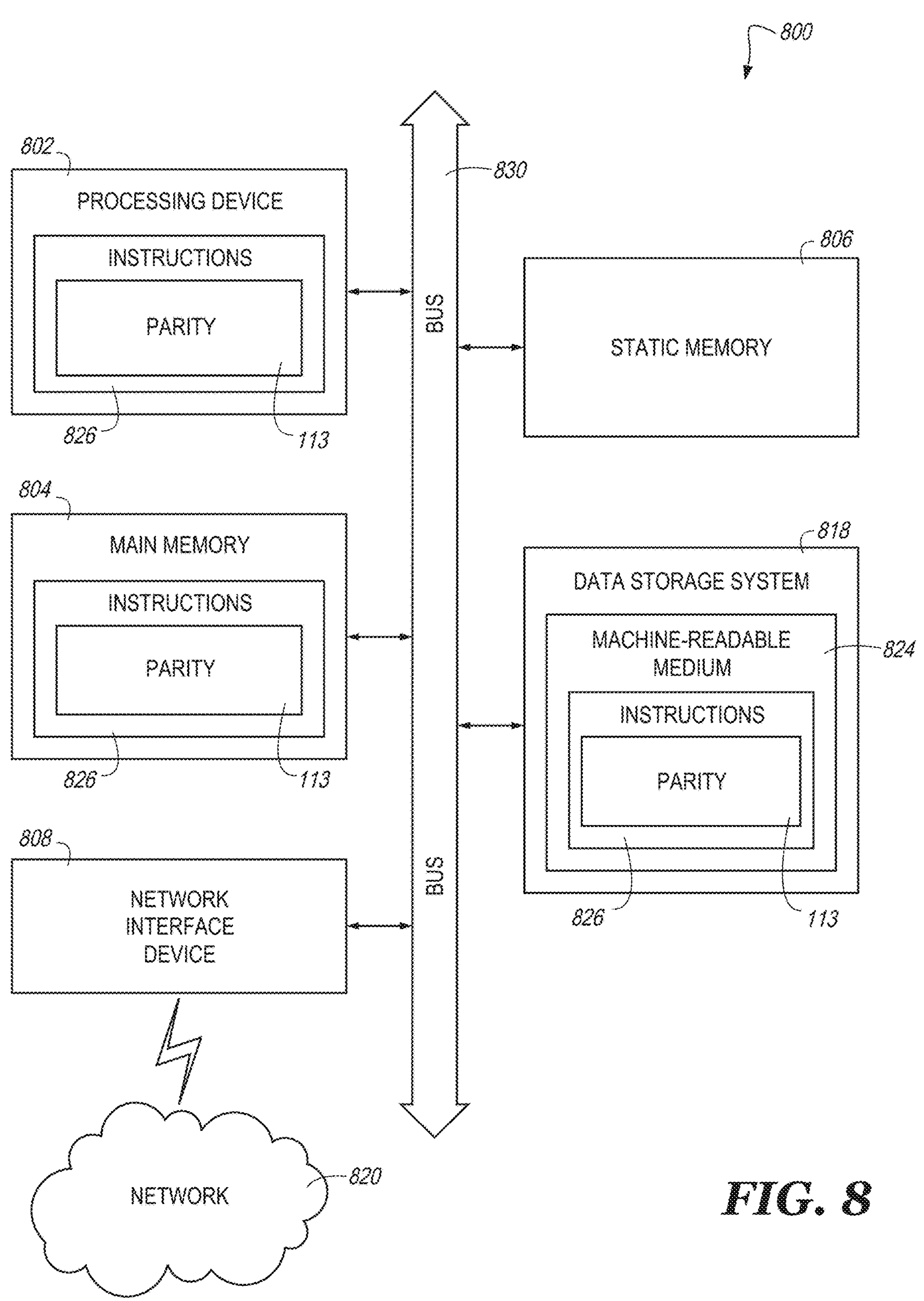
FIG. 8 is a block diagram of an example computer system in which embodiments of the present disclosure may operate.

FIG. 8 is a block diagram of an example computer system 800 in which embodiments of the present disclosure may operate. For example, FIG. 8 illustrates an example machine of a computer system 800 within which a set of instructions, for causing the machine to perform any one or more of the methodologies discussed herein, can be executed. In some embodiments, the computer system 800 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the voltage scaling circuitry 113 and the PHY I/O device 123 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a data storage system 818, which communicate with each other via a bus 830.

The processing device 802 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 802 can also be one or more special-purpose processing devices such as an application specific integrated circuit (ASIC), a field programmable gate array (FPGA), a digital signal processor (DSP), network processor, or the like. The processing device 802 is configured to execute instructions 826 for performing the operations and steps discussed herein. The computer system 800 can further include a network interface device 808 to communicate over the network 820.

The data storage system 818 can include a machine-readable storage medium 824 (also known as a computer-readable medium) on which is stored one or more sets of instructions 826 or software embodying any one or more of the methodologies or functions described herein. The instructions 826 can also reside, completely or at least partially, within the main memory 804 and/or within the processing device 802 during execution thereof by the computer system 800, the main memory 804 and the processing device 802 also constituting machine-readable storage media. The machine-readable storage medium 824, data storage system 818, and/or main memory 804 can correspond to the memory sub-system 110 of FIG. 1.

In one embodiment, the instructions 826 include instructions to implement functionality corresponding to voltage scaling circuitry and a PHY I/O device (e.g., the voltage scaling circuitry 113 and the PHY I/O device 123 of FIG. 1). While the machine-readable storage medium 824 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read-only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. An apparatus, comprising:
- a physical input/output (PHY I/O) device, wherein a processing device is configured to:
  - receive a bit string including parity information, provided from a memory device over a channel; and
- a processing device coupled to the PHY I/O device, wherein the processing device is configured to:
  - calculate a parity mismatch value based on a comparison between memory parity information and calculated PHY I/O parity information determined by the processing device circuitry;
  - determine an actual channel error rate based on the calculated parity mismatch value;
  - and regulate a voltage in response to the determined channel error rate; and
  - wherein the processing device is further configured to:
    - determine a target parity mismatch value; and
    - regulate the voltage by altering a voltage value from a first voltage value to a second voltage value in response to a comparison between the calculated parity mismatch value and the target parity mismatch value.

2. The apparatus of claim 1, wherein:
- the channel comprises an Open NAND Flash Interface (ONFI) bus;
- the first voltage value is a nominal voltage associated with the ONFI bus; and
- the second voltage value is less than the first voltage value.

3. The apparatus of claim 1, wherein the processing device is further configured to regulate the voltage by altering the voltage value from the second voltage value to a third voltage value.

4. The apparatus of claim 3, wherein the third voltage value is less than the first voltage value and less than the second voltage value.

5. The apparatus of claim 1, wherein the processing device is further configured to:
- compare the target parity mismatch value to the calculated parity mismatch value; and
- in response to the calculated parity mismatch value being within a threshold range of the target parity mismatch value, regulate the voltage by maintaining a voltage value.

6. The apparatus of claim 1, wherein the processing device is further configured to:
- compare the target parity mismatch value to the calculated parity mismatch value; and
- in response to the comparison between the target parity mismatch value and the calculated parity mismatch value, further regulate at least one of channel termination, slew rate, bias, driving strength, pull-up/pull-down, attenuation/gain, and clocking frequency and rate.

7. A method, comprising:
- receiving, by a physical input/output (PHY I/O) device, memory parity information corresponding to a bit string;
- calculating a parity mismatch value based on a comparison between the received memory parity information and a calculated PHY I/O parity information;
- determining a target parity mismatch value;
- comparing the calculated parity mismatch value and the determined target parity mismatch value; and
- regulating a voltage in response to the comparison between the calculated parity mismatch value and the target parity mismatch value.

8. The method of claim 7, wherein regulating the voltage comprises increasing the voltage in response to the calculated parity mismatch value being higher than the target parity mismatch value by a first threshold amount.

9. The method of claim 7, wherein regulating the voltage comprises decreasing the voltage in response to the target parity mismatch value being higher than the calculated parity mismatch value by a second threshold amount.

10. The method of claim 7, wherein regulating the voltage comprises maintaining a voltage value in response to the calculated parity mismatch value being within a threshold range of the target parity mismatch value.

11. The method of claim 7, further comprising receiving the bit string from a memory device coupled to the PHY I/O device via an Open NAND Flash Interface (ONFI) channel.

12. The method of claim 11, further comprising:

decoding a codeword of the bit string received by the physical input/output (PHY I/O) device to determine an actual total error rate;

determining an actual channel error rate based on the calculated parity mismatch value; and determining an actual memory device error rate based on a difference between the actual total error rate and the actual channel error rate.

13. A system, comprising:

a memory device comprising a plurality of memory dice, wherein circuitry resident on at least one of the memory dice is configured to:

write data, received from a physical input/output (PHY I/O) device coupled to the memory device, to the one of the plurality of memory dice;

read data from the one of the plurality of memory dice;

append parity information, generated by the circuitry, to the data read from the one of the plurality of memory dice to generate a first bit string comprising the read data and the parity information; and transmit the first bit string to the PHY I/O device via a channel;

the PHY I/O device, wherein the PHY I/O device is configured to:

transmit data to the memory device; and receive the first bit string comprising the read data and memory parity information transmitted from the memory device via the channel; and a processing device coupled to the PHY I/O device, wherein the processing device is configured to:

compare the received memory parity information to PHY I/O parity information calculated by the processing device;

calculate a parity mismatch value based on the comparison between the received memory parity information and the calculated PHY I/O parity information;

determine an actual channel error rate based on the calculated parity mismatch value;

regulate a voltage in response to the calculated parity mismatch value; and wherein the processing device is further configured to:

utilize a decoder coupled to the processing device to decode data in a codeword received in the bit string;

determine an actual total error rate based on the data in the codeword; and calculate an actual memory device error rate based on a difference between the actual total error rate and the actual channel error rate.

14. The system of claim 13, wherein the processing device is further configured to:

determine a target parity mismatch value;

compare the target parity mismatch value to the calculated parity mismatch value; and regulate the voltage to alter the actual channel error rate, wherein altering the actual channel error rate alters a parity mismatch value between memory parity information received by the PHY I/O from a second bit string transmitted by the memory device.

15. The system of claim 14, wherein regulating the voltage comprises:

increasing the voltage in response to the calculated parity mismatch value being higher than the target parity mismatch value by a first threshold amount; and decreasing the voltage in response to the target parity mismatch value being higher than the calculated parity mismatch value by a second threshold amount.

16. The system of claim 14, wherein the processing device is further configured to:

compare the target parity mismatch value to the calculated parity mismatch value; and in response to the calculated parity mismatch value being within a threshold range of the target parity mismatch value, regulate the voltage by maintaining a voltage value.

17. The system of claim 13, wherein regulating the voltage comprises altering the voltage from a nominal voltage value associated with an Open NAND Flash Interface (ONFI) bus to a second voltage level lower than the nominal voltage value.

18. An apparatus, comprising:

a physical input/output (PHY I/O) device, wherein a processing device is configured to:

receive a bit string including parity information, provided from a memory device over a channel; and a processing device coupled to the PHY I/O device, wherein the processing device is configured to:

calculate a parity mismatch value based on a comparison between memory parity information and calculated PHY I/O parity information determined by the processing device;

determine an actual channel error rate based on the calculated parity mismatch value;

and regulate a voltage in response to the determined actual channel error rate; and wherein the processing device is further configured to:

compare a target parity mismatch value to the calculated parity mismatch value; and in response to the calculated parity mismatch value being within a threshold range of the target parity mismatch value, regulate the voltage by maintaining a voltage value.

* * * * *